United States Patent
Paul et al.

(10) Patent No.: US 8,774,741 B2
(45) Date of Patent: Jul. 8, 2014

(54) RECONFIGURABLE POWER AMPLIFIER FOR IMPROVED LOW-POWER EFFICIENCY

(71) Applicant: Black Sand Technologies, Inc., Austin, TX (US)

(72) Inventors: Susanne A. Paul, Austin, TX (US); Marius Goldenberg, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 0 days.

(21) Appl. No.: 13/800,994

(22) Filed: Mar. 13, 2013

(65) Prior Publication Data

US 2013/0281040 A1   Oct. 24, 2013

Related U.S. Application Data

(60) Provisional application No. 61/635,265, filed on Apr. 18, 2012, provisional application No. 61/710,473, filed on Oct. 5, 2012.

(51) Int. Cl.
*H01Q 11/12* (2006.01)
*H04B 1/04* (2006.01)

(52) U.S. Cl.
USPC ............. 455/127.2; 455/552.1; 330/253; 330/254; 330/277; 375/297

(58) Field of Classification Search
USPC .......... 455/114.2, 127.1, 127.2, 552.1, 553.1; 330/250, 252, 253, 254, 772; 375/296, 375/297
See application file for complete search history.

(56) References Cited

U.S. PATENT DOCUMENTS

| | | | | |
|---|---|---|---|---|
| 5,570,065 A | * | 10/1996 | Eberhardt et al. | 330/296 |
| 6,462,620 B1 | * | 10/2002 | Dupuis et al. | 330/264 |
| 7,463,092 B2 | * | 12/2008 | Kofol | 330/136 |
| 7,629,843 B2 | * | 12/2009 | Paul et al. | 330/251 |
| 7,715,812 B2 | * | 5/2010 | Tsutsui et al. | 455/127.4 |
| 8,380,146 B2 | * | 2/2013 | Parkhurst et al. | 455/552.1 |

* cited by examiner

*Primary Examiner* — Quochien B Vuong
(74) *Attorney, Agent, or Firm* — Abel Law Group, LLP (57) ABSTRACT

A radio frequency (RF) power amplifier (PA) is reconfigured to operate in a low power mode from a high power mode. The RF PA has a first RF amplifier is connected to the first and second inputs of a first transformation network. The RF PA has a second a second RF amplifier connected to a second transformation network. During high power mode, both RF amplifiers drive a load coupled to the transformation networks. In low power mode the first RF amplifier is disabled and the first and second inputs of the first transformation are coupled together so as to change the load impedance seen by the second RF amplifier. The second RF amplifier continues to supply power to the load during operation in the low power mode.

23 Claims, 10 Drawing Sheets

RECONFIGURABLE POWER AMPLIFIER FOR IMPROVED LOW-POWER EFFICIENCY

CROSS-REFERENCE TO RELATED APPLICATION(S)

This application claims benefit of provisional application number 61/635,265, filed Apr. 18, 2012, entitled "Reconfigurable Power Amplifier for Improved Low-Power Efficiency", and provisional application number 61/710,473, filed Oct. 5, 2012, entitled "Reconfigurable Power Amplifier for Improved Low-Power Efficiency", which applications are incorporated by reference herein.

BACKGROUND

1. Field of the Invention

Embodiments of the invention relate to power amplifiers and more particularly to reconfiguration of power amplifiers for operation in different power modes.

2. Description of the Related Art

Figure 1A:
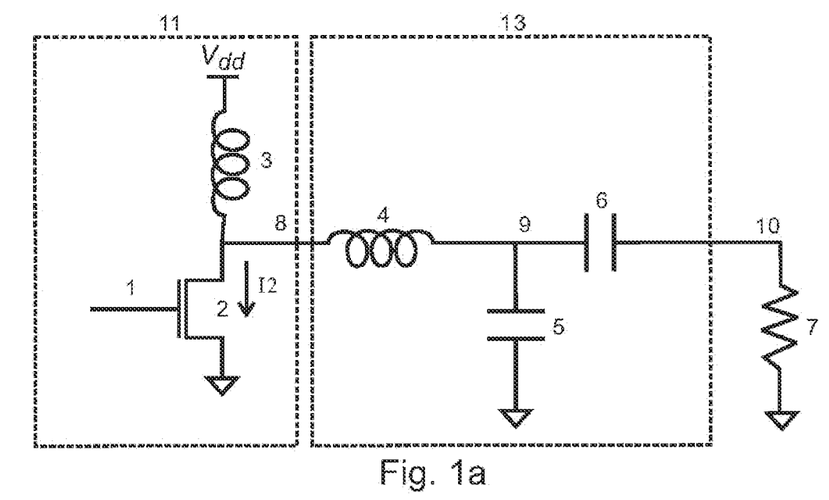
FIG. 1a shows an example of an RF power amplifier.

FIG. 1a shows an example of a radio frequency (RF) power amplifier (PA) known in the art. The RF PA shown in FIG. 1a has a gain stage, 11, followed by a matching network 13. Output node 10 is coupled to the load, symbolically presented as resistor 7, typically 50 ohms. The matching network 13 plays the role of an impedance transformation network, which converts the relatively high load impedance (e.g. 50 Ohms) into a lower impedance (e.g. 5 ohms) as seen by the output 8 of the final PA stage 11. The lower impedance reduces the maximum voltage swing present at node 8 necessary for injecting the needed maximum output power into the load 7. The matching network exemplified in FIG. 1 consists of the inductor 4 and capacitor 5, which, together with load inductor 3, form a tuned transformation circuit. Capacitor 6 blocks the DC voltage present at node 9 from reaching the load 7. The RF amplifier stage 11 receives its input on node 1.

The RF PA stage 11 consists of active device, MOSFET 2, connected in a common-source configuration, and inductor 3, connected between node 8 and power supply Vdd. The current through transistor 2 is controlled by the voltage difference between the gate terminal, connected to input node 1, and the source terminal, connected to ground. The drain of transistor 2 is connected to node 8. The voltage signal at node 8 is substantially in phase opposition to the voltage signal on the gate node 1 as a direct consequence of the common-source configuration of transistor 2. Inductor 3 plays two roles: it supplies the DC power to the active device 2 and it completes the resonant transformation network in conjunction with block 13.

Figure 1B:
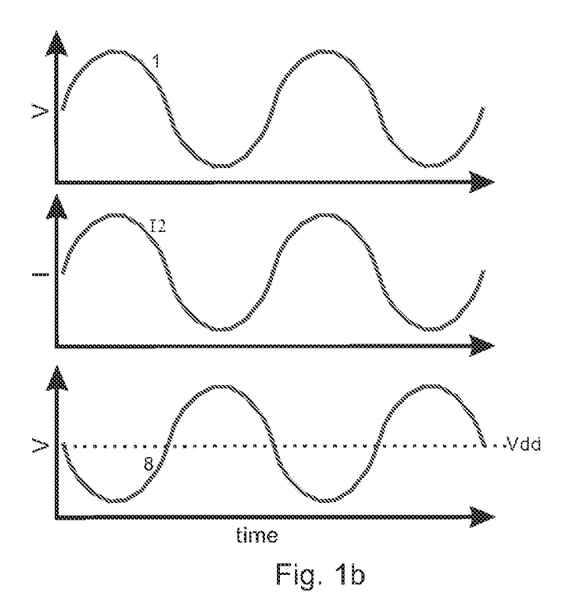

The operation of the PA presented in FIG. 1a is qualitatively illustrated by the waveforms in FIG. 1b. The PA stage 11 receives on node 1 the sinusoidal voltage waveform shown in the top graph. As a result, the current traversing the active element MOSFET 2 from drain to source will present a waveform substantially in phase to the waveform on node 1, exemplified in the middle graph of FIG. 1b. The voltage on node 8 will present a waveform substantially in phase opposition to the waveform on node 1, exemplified in the bottom graph of FIG. 1b.

The electrical power absorbed from the power supply connected to Vdd is dissipated in only two devices shown in FIG. 1a: load resistor 7 and MOSFET 2. The power dissipated in load resistor 7 represents the useful generated power that the RF PA produces and is the sole purpose of the PA. The power dissipated on the active device 2 is generally wasted as heat and brings no benefits to the PA. Thus, the efficiency of the PA, defined as the ratio of useful power to the total power absorbed from the supply, is greater if the amount of power dissipated on the active device 2 is smaller.

The PA of FIG. 1a can generate an arbitrary output RF power up to a maximum output power by means of controlling the amplitude of the voltage waveform at the input node 1. When the voltage on input node 1 changes, the amplitude of PA output 8 changes and power generated in PA load 7 changes. Maximum output power is limited by the maximum voltage amplitude achievable at node 8.

Figure 2:
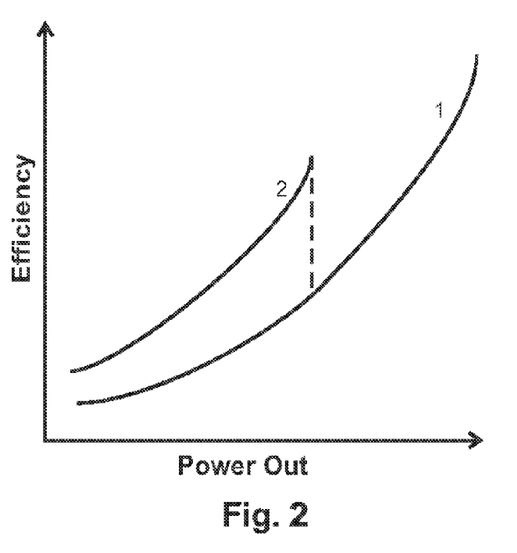
FIG. 2 illustrates the typical relationship between the PA efficiency and the output power generated by the PA.

The graph presented in FIG. 2, curve 1 shows the typical relationship between the PA efficiency and the output power generated by the PA. This relationship is described as the smaller the output power, the lower the efficiency and is further explained below.

With respect to FIG. 1a, the average voltage between the drain and the source of the MOSFET 2 is always constant and equal to VDD. The RF voltage swing across the device periodically reduces and enhances the drain to source voltage. Due to the substantial phase opposition between the current waveform traversing MOSFET 2 from drain to source and the voltage waveform between the drain and source, the power dissipated as heat by MOSFET 2 is greater when the amplitude of the voltage waveform between the drain node 8 and the ground node is smaller. When the input of the PA stage is driven such that it generates a smaller output power, the amplitude of the voltage waveform at node 8 is smaller, increasing the power dissipated by the MOSFET 2. Thus, the smaller the output power, the lower the efficiency.

A PA that supports operation on two different power curves such as those shown in FIG. 2 is said to be operating in high power mode when on curve 1 and is said to be operating in low power mode when on curve 2. Some PAs may also offer more than 2 power modes. For example a PA that provides 3 power curves is said to operate in high, mid, and low power modes depending on which curve it is on. For simplicity the following discussion assumes only two power modes are present. However, it should be understood that the embodiments described below could be modified to add additional power modes.

Figure 3A:
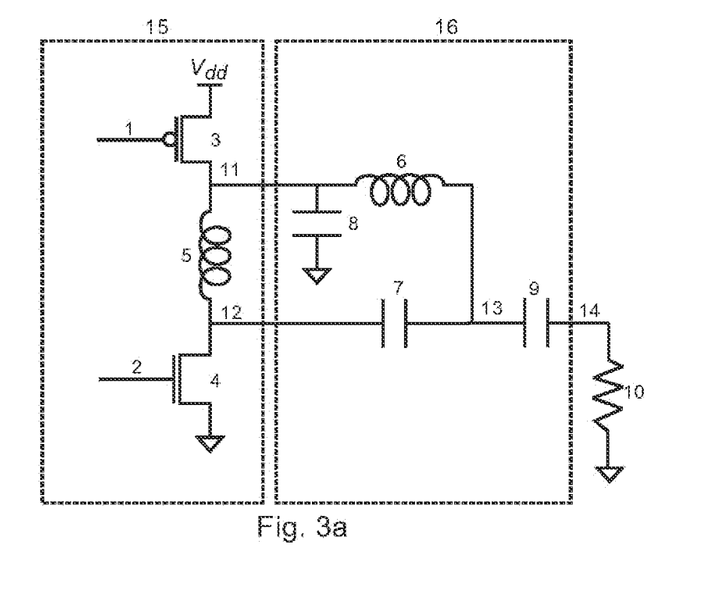
FIG. 3a shows an embodiment of a PA stage.
Figure 3B:
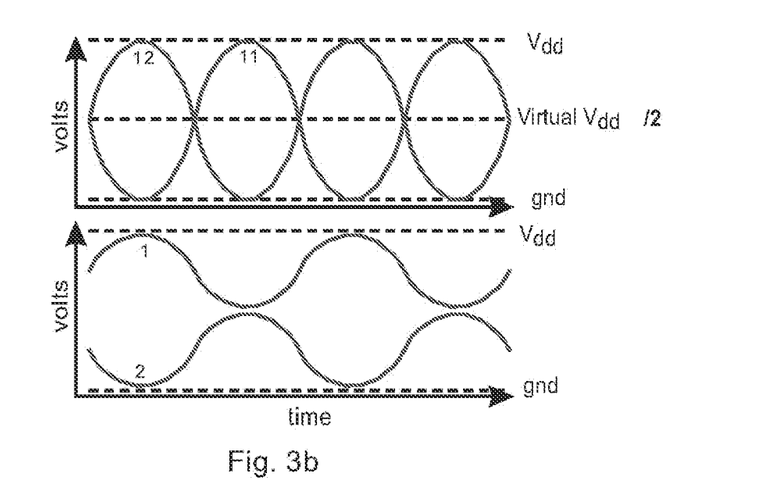
FIG. 3b shows the PA stage being driven by signals with waveforms in phase opposition.

FIG. 3a shows an embodiment of a PA stage of the prior art. It comprises gain stage 15 and transformation network 16. Resistor 10, connected between node 14 and ground, is the single-ended PA load. Gain stage 15 comprises a pair of complementary MOSFET devices, pFET 3 and nFET 4. The complementary MOS devices 3 and 4 are employed in common-source configuration, where their sources are connected to two power supply nodes, Vdd and ground, respectively, while their drains are connected to nodes 11 and 12, respectively. Inductor 5 connects node 11 and node 12 together and has two functions: allows for the flow of DC current between the two complementary devices and resonates with the capacitive component of the load impedance presented by the transformation network 16 and with parasitics to power and ground on nodes 11 and 12. The gates 1 and 2 of the complementary devices 3 and 4 are the inputs of the gain stage. Even though the PA in FIG. 3a resembles a push-pull amplifier topologically, it is fundamentally different in that the inputs 1 and 2 are driven by signals with waveform in phase opposition, as shown in the bottom graph of FIG. 3b. It is said that the inputs 1 and 2 of the gain stage form a differential node pair. The output nodes of the gain stage, 11 and 12, present voltage waveforms that are also substantially in phase opposition, as depicted in the top graph of FIG. 3b. Nodes 11 and 12 also form a differential node pair.

The gain stage 15 can operate either in nonlinear or linear modes. In nonlinear operation the inputs 1 and 2 are driven hard and the outputs 11 and 12 have voltage swings that are independent of the input amplitude. In linear operation the inputs 1 and 2 are driven with small signals and the outputs 11 and 12 have voltage swings that are proportional to their inputs. In the event that the PA is in linear operation a smaller output power is the result of smaller swings at nodes 11 and 12. Maximum output power is limited by the maximum differential voltage amplitude achievable at differential nodes 11 and 12. The gain stage described above will be, hereafter, referred to as the Class P amplifier stage.

The prior art transformation network 16 of FIG. 3a comprises the impedance elements inductor 6 and capacitors 7, 8, and 9. The values of inductor 6 and capacitor 7 can be chosen to transform the value of the PA single-ended load resistance, 10, (e.g. 50 Ohm) into a desired differential impedance between nodes 11 and 12 (e.g. 5 Ohms). Inductor 6 and capacitor 7 in the configuration of FIG. 3a, simultaneously perform the functions of impedance transformation and differential-to-single-ended conversion. Capacitor 8 controls the reactive nature of the impedance seen by the gain stage at node 11 as it is presented by the transformation network. Capacitor 9 is employed as a DC blocking element and can be chosen to have a very large value so as to not significantly influence the behavior of the transformation network.

In a manner substantially analogous to the behavior of the PA gain stage 11 of FIG. 1a, the gain stage 15 of FIG. 3a presents drain node voltages, differential nodes 11 and 12, exhibiting a substantially constant DC voltage irrespective of the output power generated by the PA. The relationship between efficiency and output power for the amplifier of FIG. 3a is also characterized by curve 1 of FIG. 2.

SUMMARY

In an embodiment a reconfigurable power amplifier (PA) includes a first transformation network including first and second inputs and an output. The PA includes a second transformation network including third and fourth inputs and an output. The first and second transformation networks are coupled together to drive a load. A first radio frequency (RF) amplifier is coupled to the first and second inputs of the first transformation network. A second RF amplifier is coupled to the third and fourth inputs of the second transformation network. In a first mode of operation the first and second RF amplifiers contribute RF power to the load. To reconfigure the PA, a first circuit is operable to disable the first RF amplifier so that it does not contribute RF power to the load in a reconfigured mode. A second circuit couples the first and second inputs of the first transformation network together in the reconfigured mode. A load impedance at the third and fourth inputs of the second transformation network is different between the first mode of operation and the reconfigured mode of operation.

In another embodiment a method includes reconfiguring a radio frequency (RF) power amplifier. The reconfiguring of the RF PA includes disabling a first RF amplifier so that it does not contribute RF power to the load and coupling first and second output nodes of the first RF amplifier together through a first circuit so as to provide a reconfigured load impedance seen by a second RF amplifier. In operation in the reconfigured mode, the second RF amplifier receives an RF signal and contributes RF power to the load.

In another embodiment a method for operating a radio frequency (RF) power amplifier includes operating the RF power amplifier in a first mode. Operating the RF PA in the first mode includes contributing power to a load from a first RF amplifier coupled to the load through a first transformation network and contributing power to the load from a second RF amplifier coupled to the load through a second transformation network. The RF power amplifier is reconfigured to operate in a second mode by disabling the first RF amplifier so that the first RF amplifier does not contribute RF power to the load and coupling the inputs of the first transformation network together to form a load impedance seen by an active RF amplifier in the second mode.

BRIEF DESCRIPTION OF THE DRAWINGS

The present invention may be better understood, and its numerous objects, features, and advantages made apparent to those skilled in the art by referencing the accompanying drawings.

FIG. 1b depicts waveforms illustrating operation of the PA of FIG. 1a.

DETAILED DESCRIPTION

One way to increase the PA efficiency at a given output power in low power mode is to modify the transformation network 13 of FIG. 1a so as to present a larger load impedance as seen from node 8, thus increasing the amplitude of the voltage waveform at the drain node 8. That can be achieved by modifying the component values of the transformation network in the direction of increasing the value of inductor 4 while decreasing the value of capacitor 5. The efficiency versus output power relationship for the PA stage with the modified transformation network is shown in FIG. 2, curve 2.

Curve 2 is characterized by a higher efficiency than curve 1 at any given PA output power that curve 2 can generate. Curve 2 is also characterized by a smaller maximum output power than curve 1. When a PA is to produce high power it can use curve 1. When it is to produce lower power it can be modified to use curve 2 so as to increase the efficiency at lower output power levels.

The PA in FIG. 1a can be modified to use the high power mode curve of FIG. 2 at high powers and the low power mode curve of FIG. 2 at low powers, as described above, by allowing the values of elements 5 and 4 to change depending on the power level. However, for reasons well known to those skilled in the art, variable inductors and capacitors are difficult to build and bring significant power losses. Embodiments of the present invention avoid the abovementioned disadvantage by allowing the PA to achieve a variable load impedance without the requirement to change the transformation network reactive element values.

Figure 4:
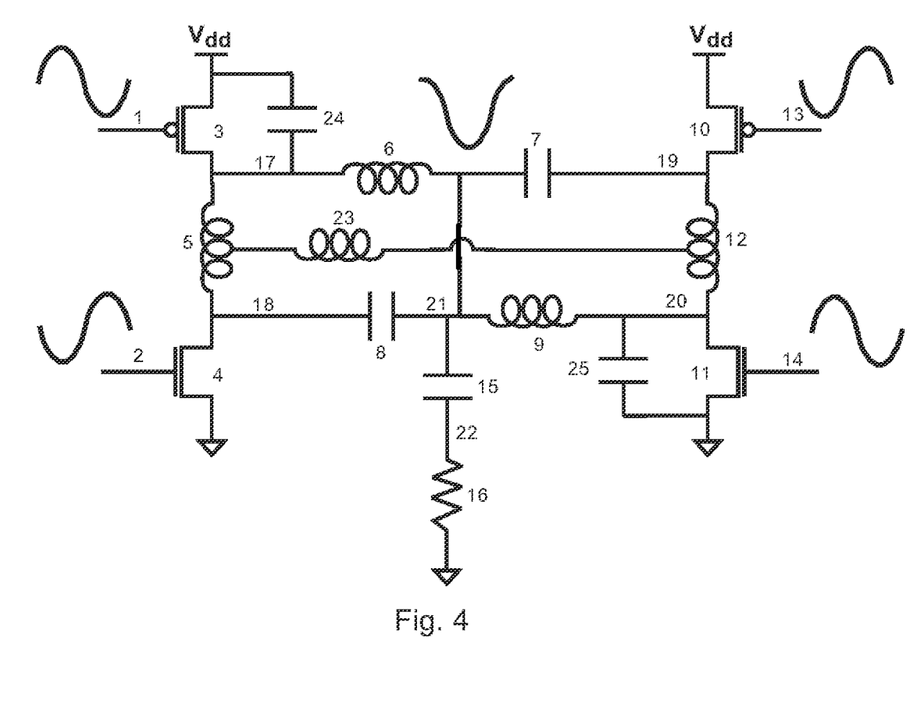
FIG. 4 shows an amplifier implemented differentially using two Class P amplifiers.

An amplifier in embodiments of the present invention may be implemented differentially using two of the Class P amplifiers in FIG. 3a connected together as shown in FIG. 4. FIG. 4 shows a first amplifier comprised of MOSFET devices 3 and 4, inductor 5, and a transformation network comprised of capacitor 8 and inductor 6, and capacitor 24. A second Class P amplifier is comprised of MOSFET devices 10 and 11, inductor 12, and a transformation network comprised of capacitor 7 and inductor 9, and capacitor 25. The two amplifiers are similar to each other, with the inductors 6 and 9 and capacitors 8 and 7 interchanged as shown. Inductor 23 links an intermediate point along the body of inductor 5 of the first Class P amplifier with an intermediate point along the body of the inductor 12 belonging to the second Class P amplifier. Node 21 is the shared output of the two Class P amplifiers presenting a voltage waveform, which is the result of the simultaneous operation of the two Class P amplifiers. Capacitor 15 performs the DC blocking function and feeds the amplifier load resistor 16. Input signals 1 and 2 of the first Class P amplifier are of opposite phases to one another and have the phase relationships shown in the figure. Input signals 13 and 14 of the second Class P amplifier are of opposite phases to one another and have phases that are opposite to those in the first Class P amplifier as is shown in the figure. The amplifier topology of FIG. 4 will be, hereafter, referred to as the differential Class P amplifier.

The impedance network connected between the output nodes of the two Class P amplifier gain stages, nodes 17, 18, 19, and 20, and the PA output node 22, forms a dual lumped-element transformation network, which combines the power of the two differential Class P amplifiers and drives the single-ended load resistor 16. The two differential amplifiers can be construed as devices 3 and 4 for the first amplifier, and devices 10 and 11 for the second amplifier. However an equally significant system partition can logically construe the two differential amplifiers as devices 3 and 10 for the first amplifier, and devices 4 and 11 for the second amplifier.

For illustrative purposes consider a PA having the topology of FIG. 4 and where all 4 active devices, 3, 4, 10, and 11, have identical gains and voltage swings on their gates and where inductors 6 and 9 are identical and capacitors 7 and 8 are identical. In this example, nodes 18 and 19 have identical voltage waveforms and can be shorted together without altering circuit behavior. Similarly, nodes 17 and 20 have identical voltage waveforms and can be shorted together without altering circuit behavior. Thus the differential Class P circuit of this illustration can be converted into a single Class P amplifier where the transformation network inductor is the parallel combination of inductors 6 and 9 and where the transformation network capacitor is the parallel combination of capacitors 7 and 8. This equivalent Class P amplifier is thus characterized by a transformation network inductor of half the size and by a transformation network capacitor of twice the size.

The differential Class P amplifier exhibits a substantially constant DC voltage at the drain nodes of the four active devices irrespective of the output power generated by the PA. The relationship between the efficiency and output power for the amplifier of FIG. 4 is also characterized by the high power mode curve of FIG. 2.

Figure 5:
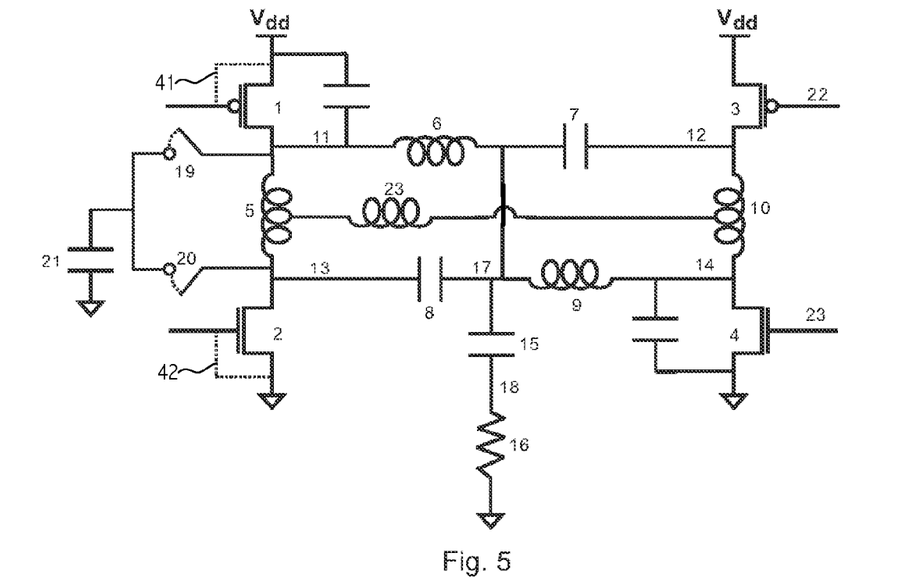
FIG. 5 shows how a differential class P power amplifier and a dual lumped-element transformation network can be reconfigured to improve the circuit's efficiency at low power levels according to an embodiment of the present invention.

FIG. 5 shows how a differential class P power amplifier and a dual lumped-element transformation network can be reconfigured to improve the circuit's efficiency at low power levels according to an embodiment of the present invention. Operation in the reconfigured low power mode is as follows. Transistors 3 and 4 continue to perform active RF amplification of the signals on their respective gates, 22 and 23. Transistors 1 and 2 are placed in a high impedance state, and therefore disabled as amplifying devices, by connecting their gates and sources together using switch elements represented as dotted lines 41 and 42. The DC levels of nodes 11, 12, 13, and 14 are all the same because these nodes are all connected together through inductors 5, 10, and 23. The DC level lies at an intermediate voltage somewhere between Vdd and ground.

In the reconfigured low power mode, switches 19 and 20 are closed so that the large capacitance of capacitor 21 creates an RF ground on nodes 11 and 13 and nodes 11 and 13 are connected together. When elements 6 and 8 are sized for operation in the original mode, they are resonant at the desired operating frequency. In the reconfigured mode these elements form a resonant parallel LC tank and present a high impedance between nodes 17 and 11/13. As a result, the reconfigured circuit behaves as if elements 1, 2, 6, and 8 were disconnected entirely. Consider the hypothetical illustration described above with reference to FIG. 4, where diagonal nodes could be shorted without altering circuit operation. The resulting transformation network for the reconfigured embodiment of FIG. 5 has a larger L value that is now that of inductor 9 alone rather than that of inductor 9 in parallel with inductor 6. The resulting transformation network has a smaller C that is now that of capacitor 7 alone rather than that of capacitor 7 in parallel with capacitor 8. The new larger L and smaller C are still resonant at the desired operating frequency but in contrast to before reconfiguration now produce a differential impedance seen between nodes 12 and 14 that is increased. Compared to the original high power mode configuration, this reconfigured low power mode results in a lower maximum power level but also results in a higher efficiency at all power levels that are still achievable.

FIG. 5 shows an embodiment of the present invention where NMOS and PMOS transistors are used to implement the Class P amplifier. However, other types of devices, including FETs or BJTs, could be used for amplification as well. Although the behavior of FIG. 5 is described as if the passive elements involved were ideal, it is understood that operation will change slightly when non-ideal passives are used and that this slight deviation does not meaningfully change the qualitative description or the usefulness of the various embodiments described herein. Although elements 6 and 8 are described to have a parallel combination that is resonant at the desired operating frequency, in an actual implementation its resonance will be slightly different from the desired operating frequency. This small frequency difference does not meaningfully change the qualitative description or the effectiveness of the various embodiments described herein.

Figure 6:
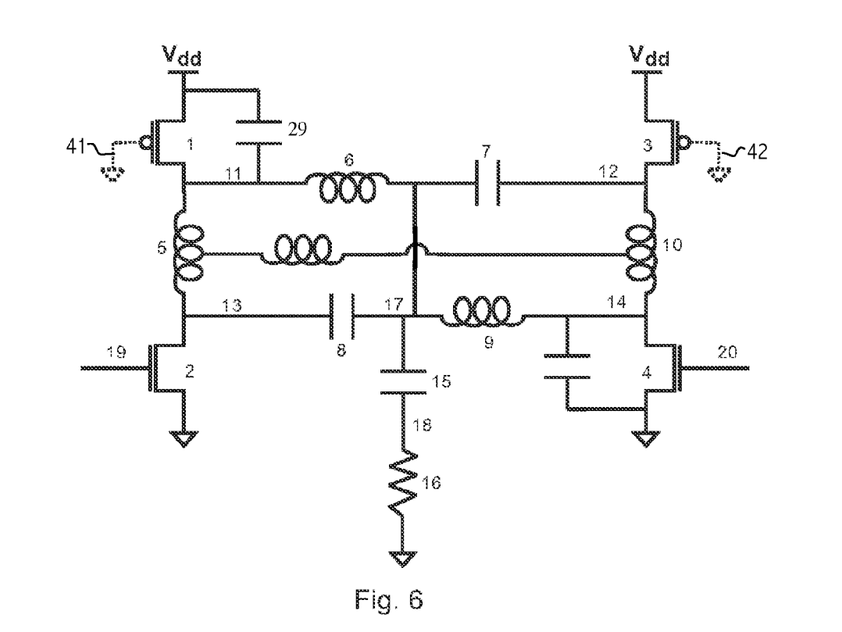
FIG. 6 shows an alternative embodiment for reconfiguring a differential class P power amplifier and a dual lumped-element transformation network.

FIG. 6 shows an alternate method of reconfiguring a differential class P power amplifier and a dual lumped-element transformation network according to an embodiment of the present invention. Operation in the reconfigured mode is as follows. Transistors 2 and 4 continue to perform active RF amplification of the signals on their respective gates 19 and 20. The gates of PMOS transistors 1 and 3 are tied to a voltage, such as ground, using switch elements represented as dotted lines 41 and 42, so that these transistors are both fully on and they create RF grounds on nodes 11 and 12 by clamping these nodes to Vdd. In this embodiment the DC level of nodes 11, 12, 13, and 14 is at Vdd. In this embodiment elements 6 and 7 form a parallel LC tank and effectively disconnect the upper half of the circuit, including elements 1, 3, 6, 7, and 29, from the lower half of the circuit. Transistors 2 and 4 now see a differential impedance that is larger than before, produce less power for a given gate swing than before, but produce that power at a higher efficiency than before.

Figure 7:
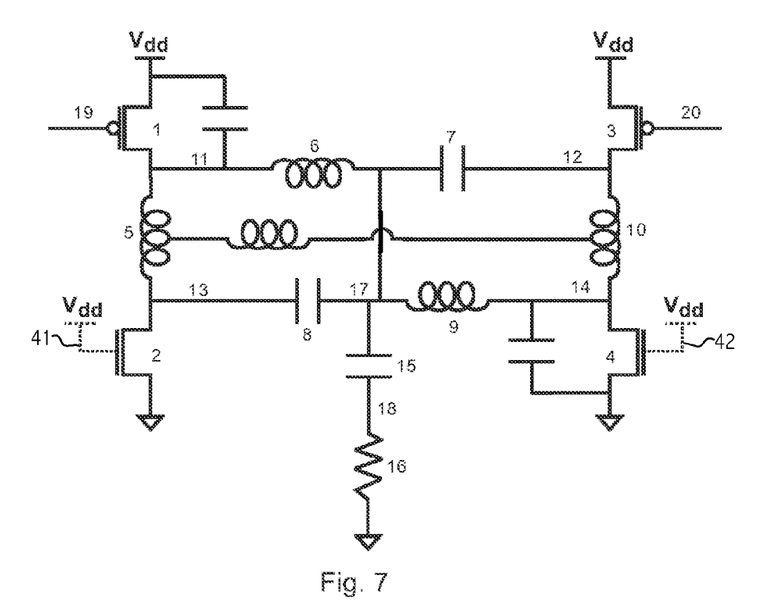
FIG. 7 shows an embodiment in which operation in the reconfigured mode involves tying the gates of transistors to a voltage to clamp nodes to ground.

FIG. 7 shows another embodiment of the present invention. Operation in the reconfigured mode involves tying the gates of transistors 2 and 4 both to a voltage, such as Vdd, using switch elements represented as dotted lines 41 and 42, so that they are both firmly on and clamp nodes 13 and 14 to ground. In this embodiment the DC level of nodes 11, 12, 13, and 14 is ground. The remaining active transformation network consists of inductor 6 and capacitor 7, which result in a differential impedance between nodes 11 and 12 that is larger than before. The resulting PA produces lower power for a given gate voltage swing than before but does so at a higher efficiency.

Figure 8:
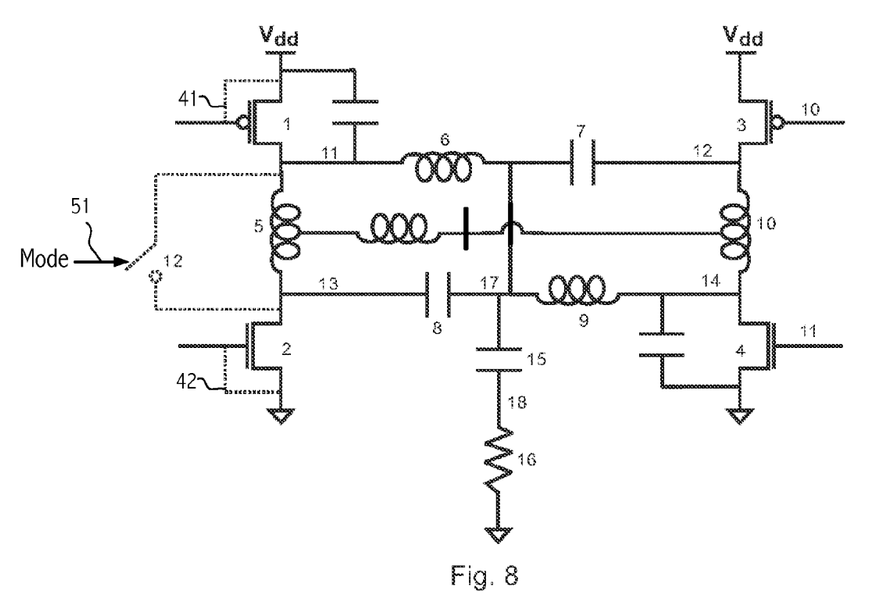
FIG. 8 shows an embodiment requiring a single switch to couple together input nodes of the transformation network.

FIG. 8 shows another embodiment of the present invention. This embodiment is similar to that in FIG. 5 but is simpler in that it only requires a single switch, instead of 19 and 20 in FIG. 5, and does not require capacitor 21 of FIG. 5. In the reconfigured mode transistors 1 and 2 are placed in a high impedance state by pulling their gates to their sources using switch elements represented as dotted lines 41 and 42. Switch 12 connects nodes 11 and 13 together, which makes elements 6 and 8 form a parallel LC tank that is resonant and creates an infinite impedance between nodes 17 and 11/13. In practical applications, nodes 11 and 13 have significant parasitic capacitances to RF ground on them and this parasitic capacitance performs the function of capacitor 21 of FIG. 5. Nodes 11 and 13 behave as RF grounds and the circuit behaves similarly to that in FIG. 5. The differential impedance seen by transistors 3 and 4 is increased, the RF swings on nodes 12 and 14 at a given output power are increased, and therefore the efficiency of the amplifier is increased.

The embodiment of FIG. 8 brings several advantages over the embodiment of FIG. 6 or 7. First, the two active transistors 3 and 4 are stacked and therefore share DC current. This can result in lower DC current consumption in the amplifier for a given gain. The second advantage of the embodiment in FIG. 8 is that its DC level for nodes 12 and 14 lies at an intermediate voltage between Vdd and ground and this results in a lower peak voltage across transistors 3 and 4 compared to that in FIG. 6 or 7. This may be helpful when transistors have low breakdown voltages.

Figure 9:
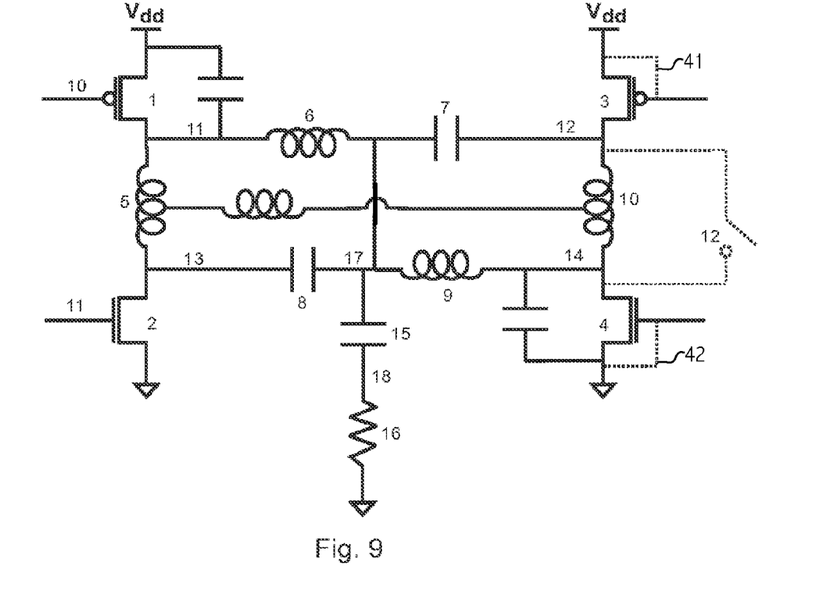
FIG. 9 shows another embodiment using a single switch to couple input nodes of the transformation network together.

Switch 12 of FIG. 8 can be located between any two nodes of a differential pair. In other words, switch 12 connects to a transformation network capacitor on one end and a transformation network inductor on the other end. FIG. 9 shows as example where switch 12 is connected between nodes 12 and 14 rather than 11 and 13. In this case, transistors 3 and 4 are placed in a high impedance state using switch elements represented as dotted lines 41 and 42 and transistors 1 and 2 are the active RF amplifier devices.

Figure 10:
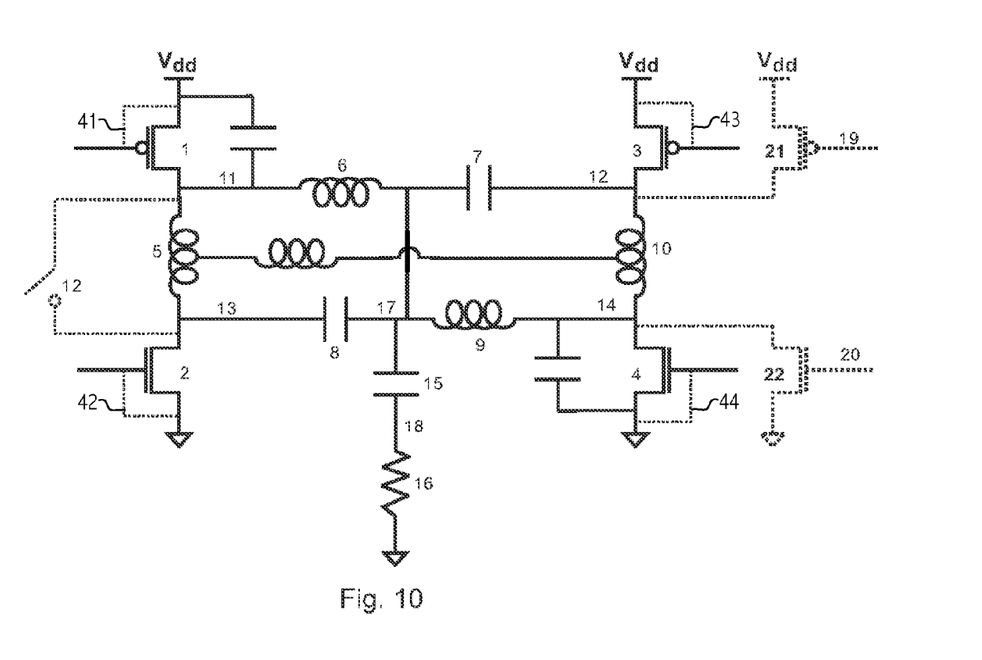
FIG. 10 shows an embodiment in which additional transistors are added to perform the RF amplification of signals in the reconfigured mode.

FIG. 10 shows another embodiment of the present invention. The method of reconfiguration is similar to that in FIG. 8 in that transistors 1 and 2 are placed in a high impedance state using switch elements represented as dotted lines 41 and 42 and nodes 11 and 13 are turned into RF grounds by switch 12. The difference between the embodiment in FIG. 10 and that in FIG. 8 is that in FIG. 10 transistors 3 and 4 are also placed in a high impedance state using switch elements represented as dotted lines 43 and 44 and therefore are not operating as RF amplifier devices. Instead, transistors 21 and 22 are added to perform the RF amplification of signals on their respective gates 19 and 20 and thus become the active RF amplifier in the reconfiguration mode. Before reconfiguration, transistors 21 and 22 are maintained in a high impedance state and therefore do not participate in the amplification process.

This embodiment can produce even higher efficiencies than the one of FIG. 8 because smaller transistors can be used for 21 and 22. In the original form, before reconfiguration, all 4 passive elements 6, 7, 8 and 9 contributed to the transformation network and both the left and right class P amplifiers were loaded by a low impedance. Larger transistor sizes are needed for 1, 2, 3, and 4 to drive this low impedance so as to create RF voltage swings comparable to Vdd at nodes 11, 12, 13, and 14. In the reconfigured state, only passive elements 7 and 9 contribute to the transformation network and the impedance seen by transistors 21 and 22 is comparatively higher so smaller transistors can be used. Less power is required to drive smaller transistors and therefore the efficiency of the circuit that generates the signals for gates 19 and 20 is improved. When transistors 21 and 22 are small they do not significantly change the performance of the amplifier in FIG. 12 prior to reconfiguration. Often the small additional parasitic capacitance at nodes 12 and 14 can be accounted for and neutralized by judicious choice of passive elements attached to the same nodes.

Figure 11:
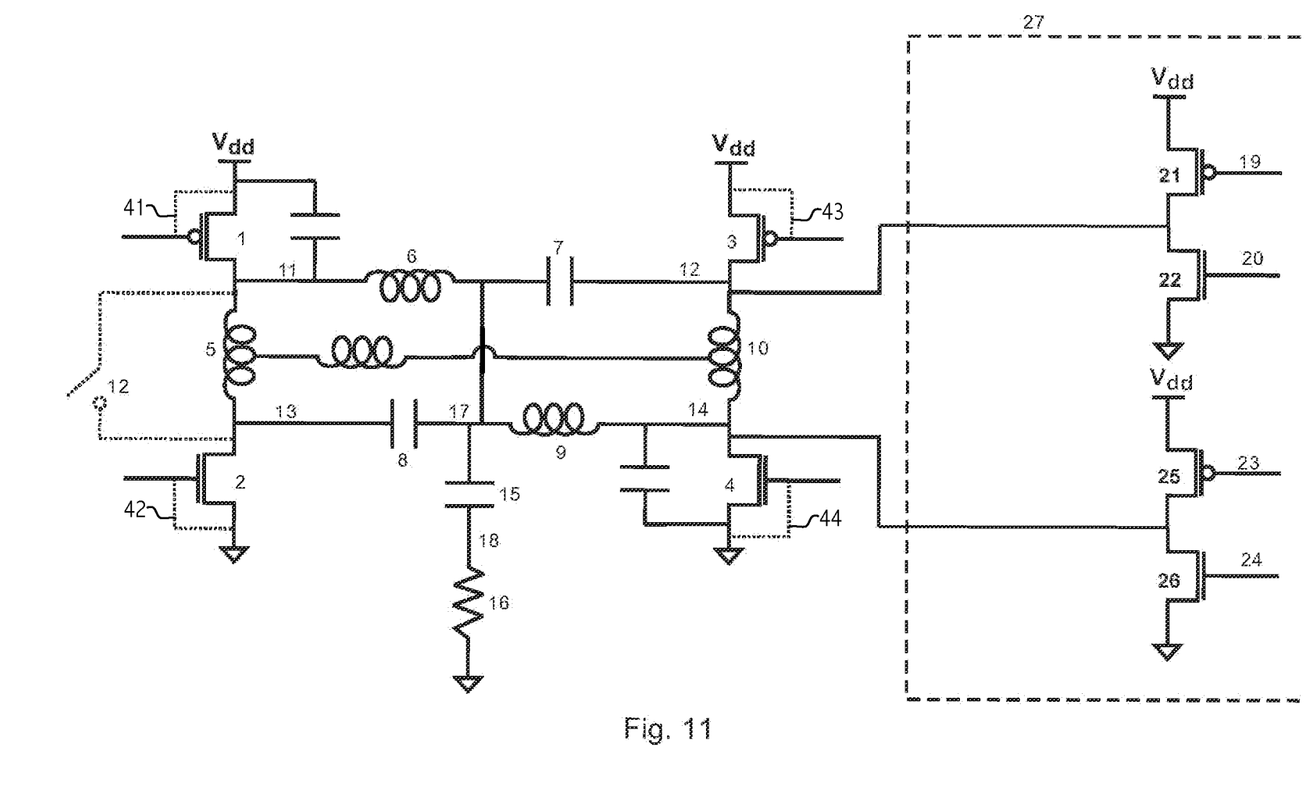
FIG. 11 shows an embodiment in which additional transistors are added to perform the RF amplification of signals in the reconfigured mode.

FIG. 11 shows a variation upon the embodiment in FIG. 10. The RF amplifier devices 21 and 22 of FIG. 10 are replaced by the RF amplifier 27 in FIG. 11 comprising devices 21, 22, 25, and 26. All 4 of these devices contribute to the RF gain of the reconfigured amplifier by performing RF amplification of signals on their respective gates 19, 20, 23 and 24. The embodiment of FIG. 11 is preferable to that in FIG. 10 when gain and quiescent current are more important metrics than efficiency at peak power. The embodiment in FIG. 11 will provide better gain and quiescent current than that in FIG. 10 but with worse peak power efficiency.

Figure 12:
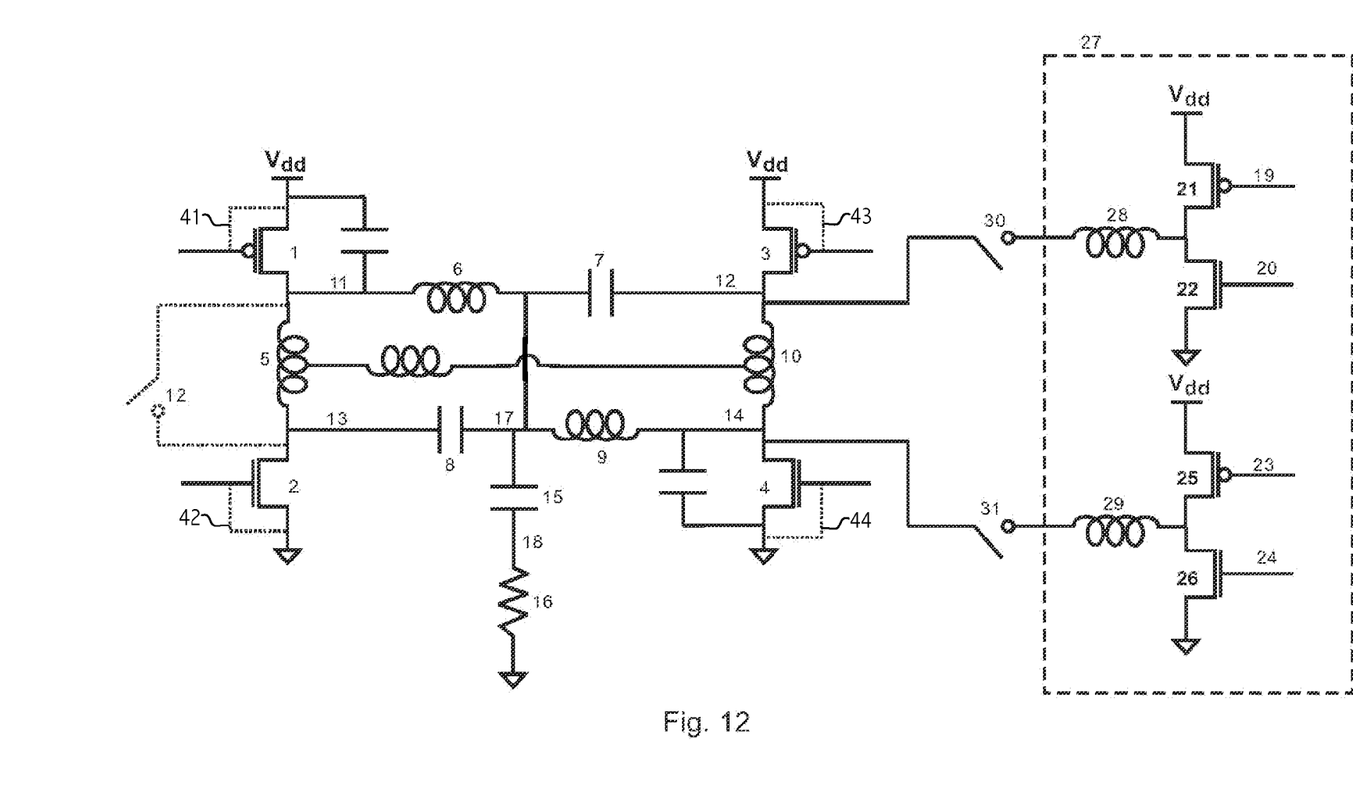
FIG. 12 shows an embodiment in which inductors have been added in series with the existing transformation network along with additional transistors to perform the RF amplification of signals in the reconfigured mode.

The embodiment in FIG. 12 differs from that in FIG. 11 in two ways. First, inductors 28 and 29 have been added in series with the existing transformation network to create a 2-stage transformation network. In most cases the values of components 7 and 9 are determined by output power requirements of the PA in high power mode. When those component values do not produce the desired load impedance in the reconfigured low power mode, then more resonant elements can be added to the reconfigured output network to create the desired load impedance. FIG. 12 shows one possible way to accomplish this, by creating a 2-stage transformation network.

Other approaches for building 2-stage transformation networks are known to those skilled in the art and could be used to change the load impedance in reconfigured mode. They might involve a combination of series or shunt reactive elements such as inductors, capacitors, or transformers.

Approaches for changing the load impedance in reconfigured mode are not limited to 2-stage transformation networks. Other approaches couple a combination of series or shunt reactive elements such as inductors, capacitors, or transformers to nodes 17, 12, or 14 in a way that alters the load impedance seen by amplifier 27.

The second difference between FIG. 12 and FIG. 11 is that switches 30 and 31 have been added to the embodiment in FIG. 12. These enable RF amplifier 27 to be disconnected from the rest of the circuit when the PA is configured for high power mode so that it does not load nodes 12 and 14. In cases where transistors 21, 22, 25, and 26 are large or when additional passive elements, such as 28 and 29, are included such isolation can provide improved power and efficiency when in high power mode.

Note that the various switches controlling reconfiguration shown herein, e.g., 12, 19, 20, 30, 31, 41, and 42, are controlled via control signals, such as mode signal 51 in FIG. 8, which are generally omitted from the drawings to simplify the drawings, and which indicate whether the RF power amplifier is in a high-power or low-power mode.

Figure 13:
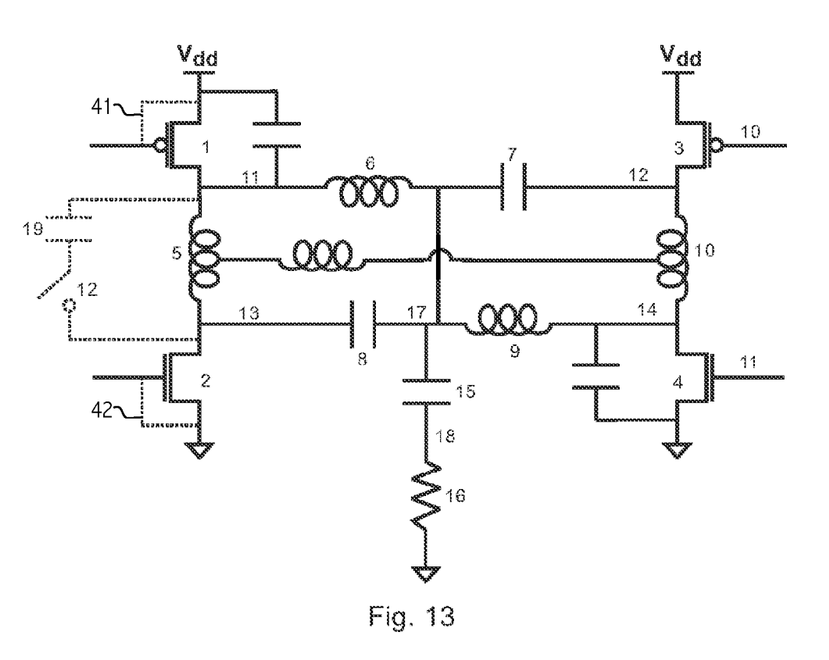
FIG. 13 illustrates an embodiment in which other intervening elements are present between the two transformation network inputs and the switch.

Although FIGS. 4 through 12 show a switch that connects two transformation network inputs together it is known to those skilled in the art that other intervening elements can be present between the two transformation network inputs and the switch. An example of this is shown in FIG. 13. A series capacitor, 19, could be included in series with the switch. One reason why this may be useful is in cases where the DC levels of nodes 11 and 13 are different but it is still desired to create an RF short between them. A second reason why this may be useful is if connecting 11 and 13 directly together does not provide the desired reconfigured load impedance to the second amplifier. A reactive element, such as an inductor or capacitor, can be included in series with the switch and this provides greater degrees of freedom to customize the reconfigured load impedance seen by transistors 3 and 4.

Although FIGS. 4 through 12 show one particular type of output network it is known to those skilled in the art that other types of transformation networks can be used in embodiments of the present invention. For example, a pair of transformers each comprising a primary winding and a secondary winding, where the secondary windings belonging to the two transformers are coupled together to drive a load while the primary windings are driven by two separate RF PAs. In this arrangement, connecting a pair of terminals associated with the primary winding of one transformer in a reconfigured mode will change the load impedance seen by the pair of terminals associated with the primary winding of the second transformer.

Although FIGS. 4 through 12 describe embodiments with an output network that contains four inputs it is known to those skilled in the art that embodiments of the present invention can include output networks with more than four inputs. For example, an embodiment could include three pairs of transformation networks. In this case, connecting one pair of terminals would change the load impedance seen by the other two pairs of terminals. Similarly connecting of two pairs of terminals would change the load impedance seen by the third pair of terminals.

While various aspects of the invention have been described herein, note that the description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A reconfigurable power amplifier comprising:
a first transformation network including first and second inputs and an output;
a second transformation network including third and fourth inputs and an output;
wherein said first and second transformation networks are coupled together to drive a load;
a first radio frequency (RF) amplifier coupled to the first and second inputs of the first transformation network;
a second RF amplifier coupled to the third and fourth inputs of the second transformation network,
wherein in a first mode of operation the first and second RF amplifiers contribute RF power to the load;
a first circuit to disable the first RF amplifier so that it does not contribute RF power to the load in a reconfigured mode of operation; and
a second circuit to couple said first and second inputs of the first transformation network together in the reconfigured mode of operation;
wherein a load impedance at the third and fourth inputs of the second transformation network is different between the first mode of operation and the reconfigured mode of operation.

2. The reconfigurable power amplifier as recited in claim 1 wherein the load impedance seen at the third and fourth inputs of the second transformation network is greater in the reconfigured mode of operation than in the first mode of operation.

3. The reconfigurable power amplifier as recited in claim 1 wherein the second RF amplifier is operable to provide power to the load in the reconfigured mode.

4. The reconfigurable power amplifier as recited in claim 1 wherein the reconfigured mode is a low power mode.

5. The reconfigurable power amplifier of claim 1
wherein said first transformation network comprises a first inductor coupled between said first input and said output and a first capacitor coupled between said second input and said output; and
wherein said second transformation network comprises a second capacitor coupled between said third input and said output and a second inductor coupled between said fourth input and said output.

6. The reconfigurable power amplifier of claim 1
wherein said first RF amplifier comprises a first transistor coupled to said first input of the first transformation network and a second transistor coupled to said second input of the first transformation network; and
wherein said second RF amplifier comprises a third transistor coupled to said third input of the second transformation network and a fourth transistor coupled to said fourth input of the second transformation network.

7. The reconfigurable power amplifier of claim 1 further comprising a capacitor coupled to the first and second inputs of the first transformation network in the reconfigured mode so as to create an RF ground.

8. The reconfigurable power amplifier of claim 1 wherein said second circuit to couple said first and second inputs of the first transformation network comprises at least one switch.

9. The reconfigurable power amplifier of claim 1 wherein said first RF amplifier is disabled by placing transistors of the first RF amplifier in a high impedance state.

10. The reconfigurable power amplifier of claim 1 further comprising:
a third circuit to disable said second RF amplifier so that it does not contribute RF power to the load in the reconfigured mode;
a third RF amplifier coupled to said third and fourth inputs of said second transformation network;
said third RF amplifier being operable to contribute RF power to the load in the reconfigured mode.

11. The reconfigurable power amplifier of claim 10 wherein said third RF amplifier comprises:

a fifth transistor coupled to said third input of said second transformation network;

a sixth transistor coupled to said fourth input of said second transformation network.

12. The reconfigurable power amplifier of claim 10 wherein said third RF amplifier comprises:

fifth and sixth transistors coupled to said third input of said second transformation network;

seventh and eighth transistors coupled to said fourth input of said second transformation network.

13. The reconfigurable power amplifier of claim 10 further comprising switches in series between said third RF amplifier and said third and fourth inputs to said second transformation network, said switches operable for isolating said third RF amplifier from said second transformation network in the first mode.

14. The reconfigurable power amplifier of claim 10 further comprising reactive elements coupled in series between said third RF amplifier and said third and fourth inputs to said second transformation network, said reactive elements forming part of the load impedance seen by said third RF amplifier in the reconfigured mode.

15. The reconfigurable power amplifier as recited in claim 1 wherein in the first mode of operation, the first and second inputs of the first transformation network are isolated from each other by the second circuit.

16. A method comprising:

reconfiguring a radio frequency (RF) power amplifier to operate in a reconfigured mode, the reconfiguring including, disabling a first RF amplifier so that it does not contribute RF power to the load;

coupling first and second output nodes of the first RF amplifier together through a first circuit to provide a reconfigured load impedance seen by a second RF amplifier; and receiving an RF signal at the second RF amplifier and contributing RF power to the load from the second RF amplifier in the reconfigured mode.

17. The method as recited in claim 16 wherein the reconfigured mode is a low power mode of operation of the RF power amplifier.

18. The method as recited in claim 16 further comprising operating the RF power amplifier in a high power mode of operation in which the first RF amplifier contributes RF power to the load and the first and second outputs nodes of the first RF power amplifier are not coupled together through the first circuit.

19. A method for operating a radio frequency (RF) power amplifier comprising:

operating the RF power amplifier in a first mode including, contributing power to a load from a first RF amplifier coupled to the load through a first transformation network;

contributing power to the load from a second RF amplifier coupled to the load through a second transformation network;

reconfiguring the RF power amplifier to operate in a second mode, the reconfiguring including, disabling said first RF amplifier so that the first RF amplifier does not contribute RF power to the load in the second mode; and coupling inputs of said first transformation network together to provide a reconfigured load impedance for use in the second mode.

20. The method as recited in claim 19 wherein reconfiguring the power amplifier further comprises:

disabling the second RF amplifier; and coupling a third RF amplifier to the second transformation network to contribute RF power to the load in the second mode.

21. The method as recited in claim 20 further comprising isolating said third RF amplifier from said second transformation network in the first mode.

22. The method as recited in claim 20 further comprising coupling reactive elements in series with the second transformation network between said third RF amplifier and inputs to the second transformation network, the reactive elements forming part of the load impedance seen by said third RF amplifier in the second mode.

23. The method as recited in claim 19 further comprising:

contributing RF power to the load in the second mode from the second RF amplifier.

* * * * *